(12) United States Patent
Fulton et al.

(10) Patent No.: US 7,392,563 B2
(45) Date of Patent: Jul. 1, 2008

(54) PROBE PIN CLEANING SYSTEM

(75) Inventors: William H. Fulton, Newtown, CT (US);
William F. Thiessen, Newtown, CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 198 days.

(21) Appl. No.: 10/756,995

(22) Filed: Jan. 14, 2004

(65) Prior Publication Data
US 2004/0134516 A1   Jul. 15, 2004

Related U.S. Application Data

(60) Provisional application No. 60/440,248, filed on Jan. 14, 2003.

(51) Int. Cl.
*B08B 1/00* (2006.01)

(52) U.S. Cl. ............... 15/210.1; 15/104.93; 15/77; 15/102

(58) Field of Classification Search ......... 15/104.92, 15/104.93, 104.94, 210.1, 97.1, 102, 91.1, 15/77
See application file for complete search history.

(56) References Cited

U.S. PATENT DOCUMENTS

| | | | | |
|---|---|---|---|---|
| 5,240,339 | A * | 8/1993 | DeForest et al. | 401/207 |
| 5,537,706 | A * | 7/1996 | Baker | 15/97.1 |
| 5,728,229 | A | 3/1998 | Despres | 134/32 |
| 6,056,627 | A | 5/2000 | Mizuta | 451/59 |
| 6,134,736 | A * | 10/2000 | Pankow | 15/104.92 |
| 6,175,983 | B1 * | 1/2001 | Hirose et al. | 15/102 |
| 6,199,238 | B1 * | 3/2001 | Huang | 15/102 |
| 6,280,298 | B1 | 8/2001 | Gonzales | 451/56 |
| 6,659,847 | B2 | 12/2003 | Liu et al. | 451/57 |
| 6,840,374 | B2 | 1/2005 | Khandros et al. | 206/223 |
| 2003/0217423 | A1 * | 11/2003 | Larsen | 15/104.92 |

FOREIGN PATENT DOCUMENTS

JP   2002177895   6/2002

OTHER PUBLICATIONS

San Diego Plastics, Inc., PVC (Polyvinylchloride), www.sdplastics.com/pvc.html.*
Computer generated translation of JP2002-177895A.*
EPO Communication dated Feb. 25, 2005.

* cited by examiner

*Primary Examiner*—Shay L Karls
(74) *Attorney, Agent, or Firm*—Wiggin and Dana LLP; Anthony P. Gangemi; Gregory S. Rosenblatt

(57) ABSTRACT

An improved device for cleaning probe pins of a probe head assembly is presented. The device includes a first holding plate, a second holding plate and a cleaning cartridge. The first holding plate secures the probe head assembly. The second holding plate secures the cleaning cartridge in proximity to the first holding plate. The cleaning cartridge has a chamber. The chamber includes a cleaning solution and an absorbent pad located therein. The absorbent pad is saturated with the cleaning solution and prevents leakage of the cleaning solution out of the chamber. During cleaning operations, the first holding plate is positioned about the second holding plate such that the probe pins of a probe head extend into and contact the absorbent pad in the chamber. Once contact is established, the cleaning solution acts upon the probe pin tips to remove unwanted debris. A depth of penetration of the pins into the pad is controlled by a surface of the cartridge.

6 Claims, 4 Drawing Sheets

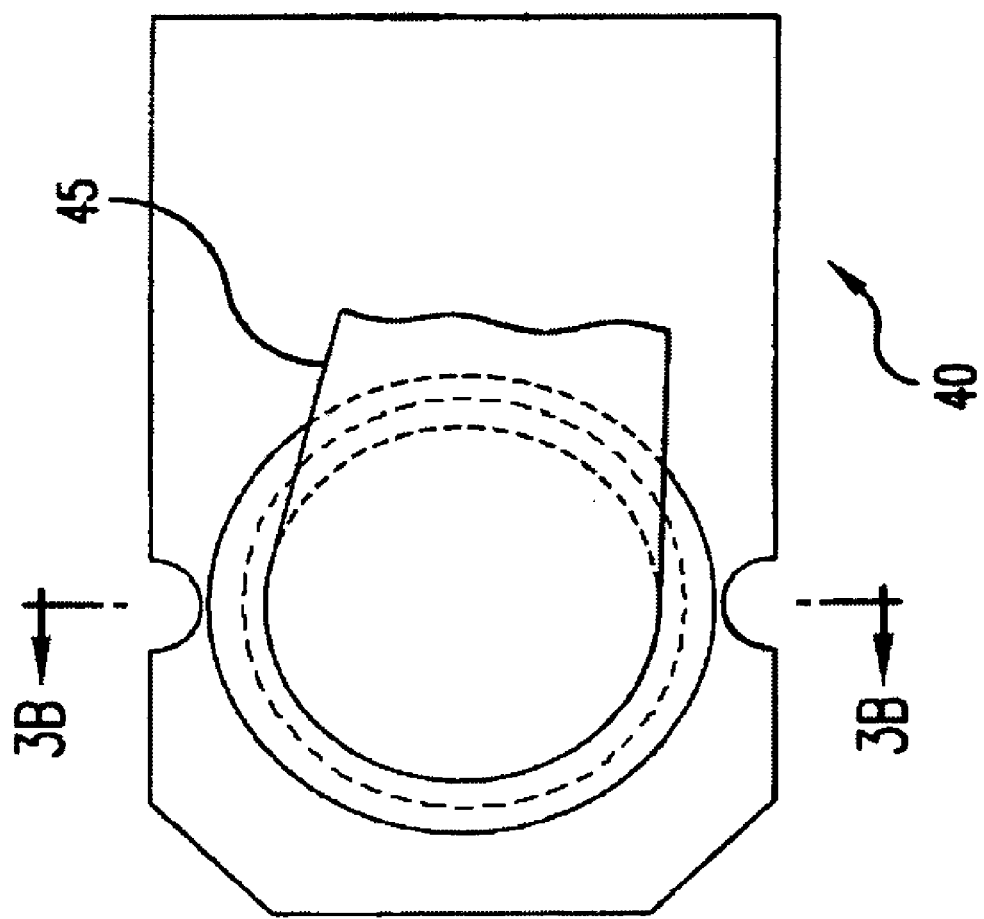
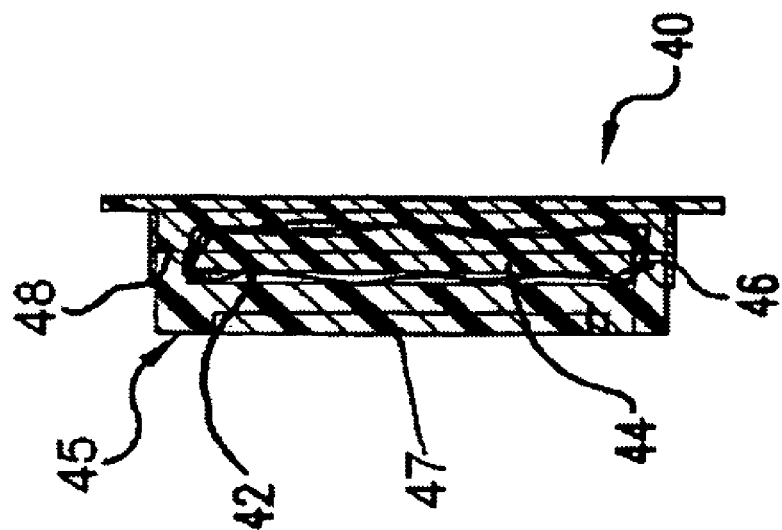
FIG.3A
FIG.3B

PROBE PIN CLEANING SYSTEM

CROSS-REFERENCE TO RELATED APPLICATIONS

This patent application claims the benefit of U.S. Provisional Patent Application Ser. No. 60/440,248, entitled "PROBE PIN CLEANING SYSTEM AND METHOD" that was filed on Jan. 14, 2003. The disclosures of this patent document is incorporated by reference in its entirety as if fully set forth herein.

BACKGROUND OF THE INVENTION

1. Field of the Invention

The present invention relates generally to probe assemblies for testing integrated circuit (IC) devices and, more particularly, to a system for cleaning tips of probe pins.

2. Description of Prior Art

During fabrication of IC devices from silicon wafers, a probe device is used to interface the IC devices to a tester. A typical probe device includes a probe card assembly having an array of probe pins that contact bond pads on the IC device during testing. The bond pads on the IC device are made from metallic materials such as tin-lead that can oxidize when exposed to air. Also, organic materials left over from certain fabrication processes can exist on the bond pads. When probe pin tips repeatedly contact bond pads, metal oxides of tin-lead and other bond pad materials can build-up on the probe pin tips. Such build-up interferes with the function of the probe pins during testing operations. Therefore, it is necessary to periodically clean probe pins on a probe card.

Conventional cleaning operations include wiping or spraying probe pins with a chemical solution. Effective chemical solutions often employ ingredients that may be hazardous to human operators and to certain components of the probe device.

Accordingly, there is a need for improving probe pin cleaning systems and methods that are effective and easy to use while being safe to both human operators and components of devices being cleaned.

OBJECTS OF THE INVENTION

Accordingly, it is an object of this invention to provide an improved probe pin cleaning system and method that removes unwanted build-up from a probe pin tips without exposing a human operator or components of the devices being cleaned to a potentially hazardous cleaning solution or debris from the cleaning operation.

Further, objects of this invention will become more apparent from a consideration of the drawings and the ensuing description.

SUMMARY OF THE INVENTION

The above and other objects are achieved by a device for cleaning probe pins of a probe card. The device includes a first holding plate, a second holding plate and a cleaning cartridge. The first holding plate secures a probe head device. The second holding plate secures the cleaning cartridge in proximity to the first holding plate. The cleaning cartridge has a chamber. The chamber houses an absorbent pad and a cleaning solution that saturates the absorbent pad. The saturated absorbent pad prevents leakage of the cleaning solution out of the chamber. During cleaning operations, the first holding plate is positioned about the second holding plate such that the probe pins of a probe head extend into and contact the absorbent pad in the chamber. Once contact is established, the cleaning solution chemically attacks unwanted metal debris and oxides on the probe tips.

BRIEF DESCRIPTION OF THE DRAWINGS

The features and advantages of the present invention will be better understood when the Detailed Description of the Preferred Embodiments given below is considered in conjunction with the figures provided, wherein:

FIG. 3A is a top plan view of a cleaning cartridge constructed in accordance with one embodiment of the present invention;

FIG. 3B is a side, cross-sectional view of the cleaning cartridge of FIG. 3A, taken along line 3B-3B;

In these figures, like structures are assigned like reference numerals, but may not be referenced in the description for all figures.

DETAILED DESCRIPTION OF THE PREFERRED EMBODIMENTS

Figure 1:
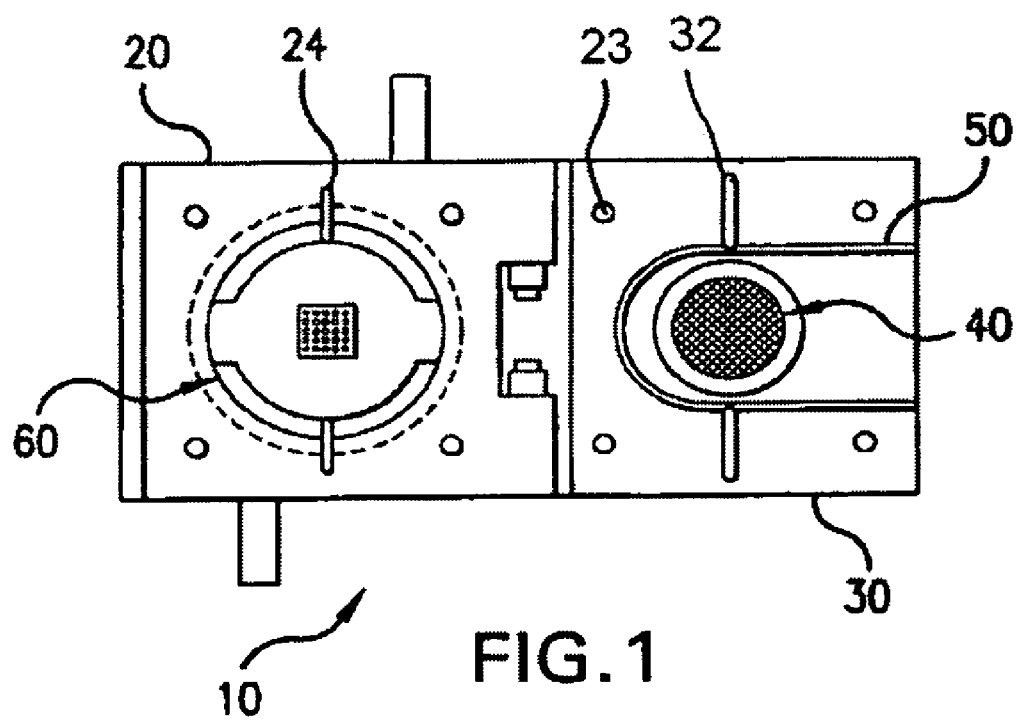
FIG. 1 is a top, plan view of an improved probe pin cleaning device constructed according to one embodiment of the present invention.
Figure 2:
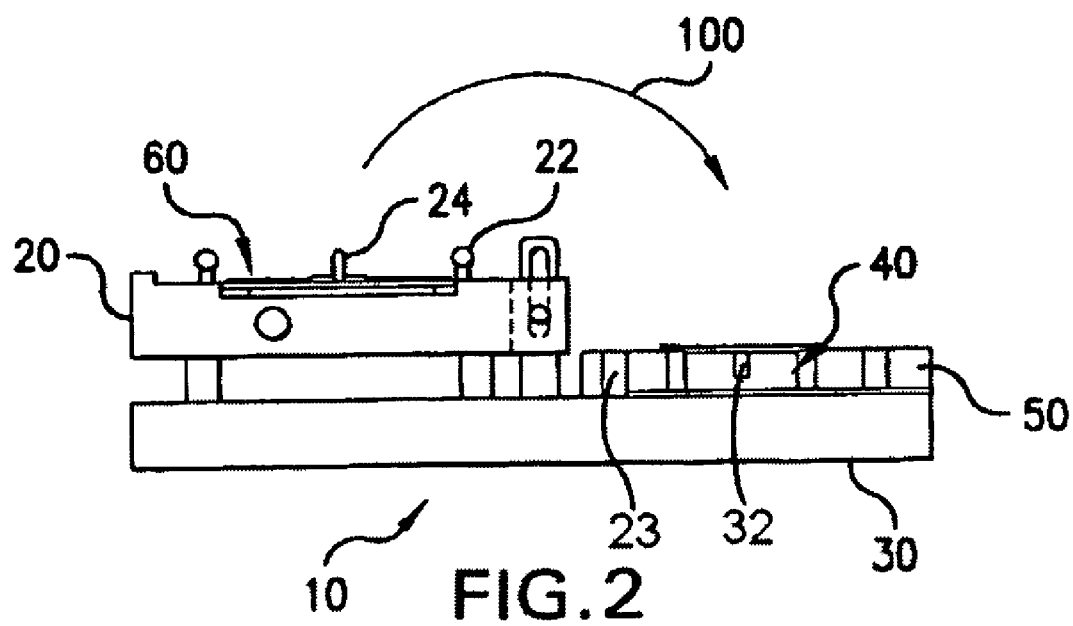
FIG. 2 is a side view of the probe pin device of FIG. 1.

FIGS. 1 and 2 illustrate a probe pin cleaning device, shown generally at 10, configured and operating in accordance with the present invention for the removal of unwanted build-up from probe pin tips. The build-up includes, for example, metal and metal oxides from bond pads of IC devices being tested with a probe device.

The probe pin cleaning device 10 includes a top holding plate 20, a bottom holding plate 30 and a cleaning cartridge 40. In one embodiment, the top holding plate 20 includes clamps 22 for securing a probe head assembly, shown generally at 60, such as, for example, probe cards sold under the trademarks COBRA® and VENOM® by Wentworth Laboratories, Inc., of Brookfield, Conn. USA. In one embodiment, the bottom plate 30 includes a key way 50 adapted to receive and retain the cleaning cartridge 40 and holes 23 for receiving clamps 22.

In accordance with the present invention and as illustrated in FIGS. 3A and 3B, the cleaning cartridge 40 includes a chamber 42, and cleaning solution 44 and an absorbent pad 46 located within the chamber 42. The absorbent pad 46 is saturated with the cleaning solution 44 and prevents leakage of the cleaning solution 44 out of the chamber 42. It should be appreciated that cleaning solutions effective for removing unwanted material from probe pin tips may be harmful to humans and/or components of the probe heads themselves. Therefore, the absorbent pad 46 substantially prevents the cleaning solution 44 from exiting the chamber 42. Additionally, once the improved probe pin cleaning device 10 has been used to clean a probe head 60, debris removed from probe pin tips is captured by the absorbent pad 46 so that it does not harm a human operator of the cleaning device 10 or components of the probe head 60.

Figure 4A:
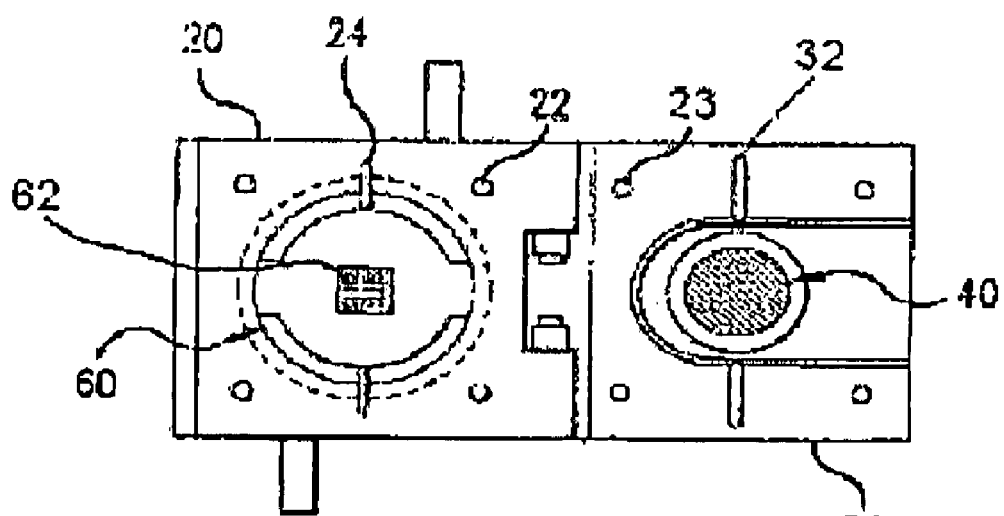
FIGS. 4A-4C illustrate a rotational engagement of top and bottom plates of the probe pin cleaning device of FIG. 1.
Figure 4B:
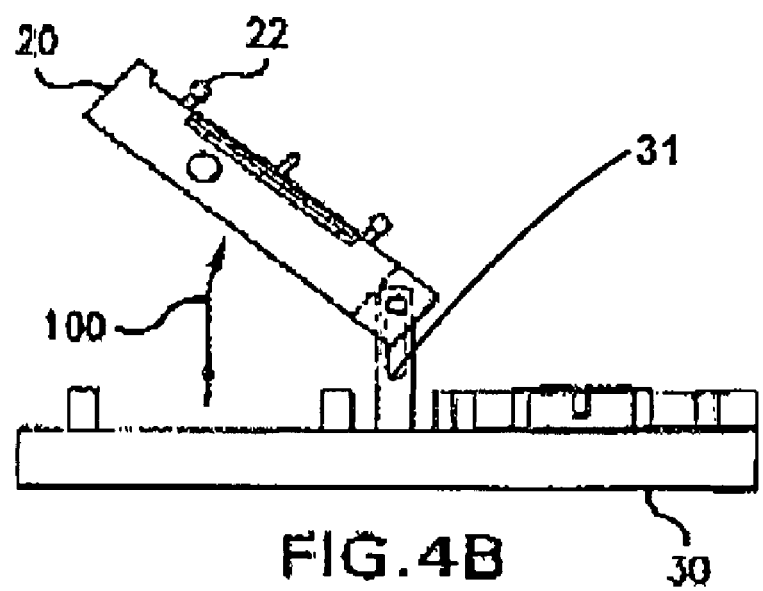
Figure 4C:
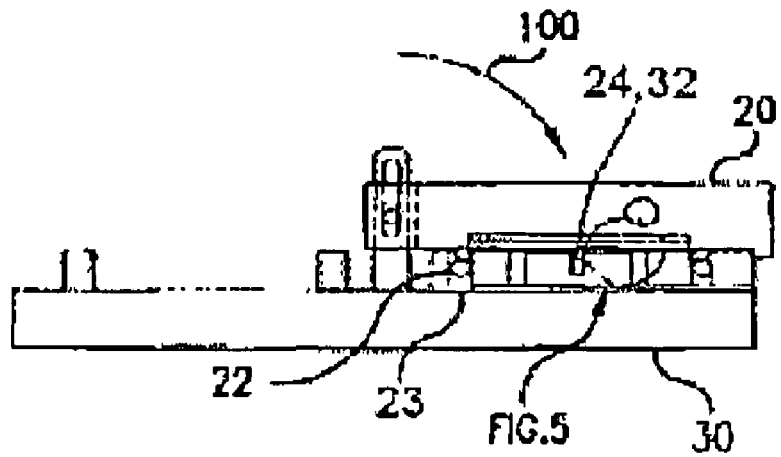
Figure 5:
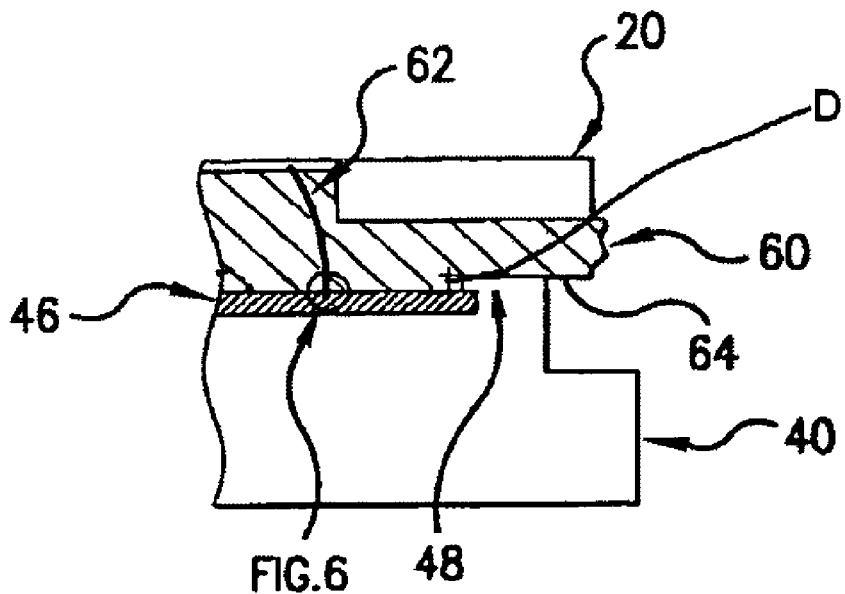
FIG. 5 is an enlarged view of the engagement of the top holding plate, bottom holding plate and cleaning cartridge of the probe pin cleaning device of FIG. 1.
Figure 6:
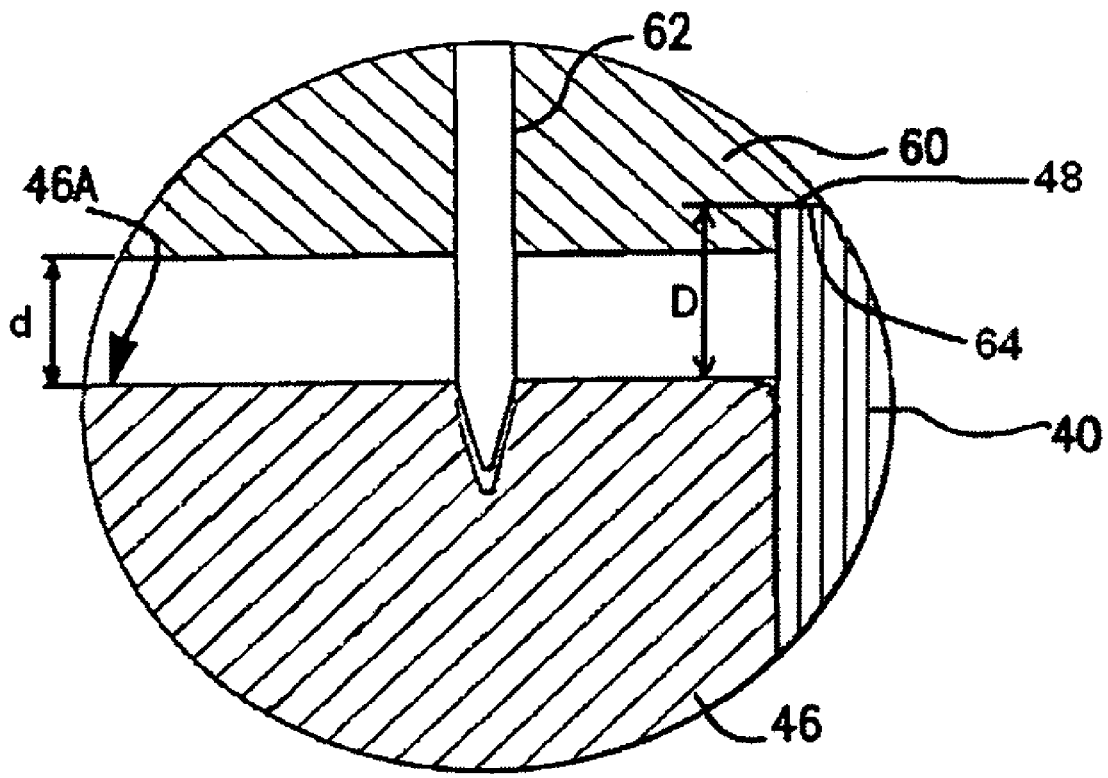
FIG. 6 is an enlarge view of the engagement of tips of probe pins and the absorbent pad of the probe pin cleaning device of FIG. 1.

In one embodiment, the top holding plate 20 is coupled to the bottom holding plate 30 to permit rotation of the top holding plate 20 from a first, open position (FIGS. 1, 2 and 4A) in a direction indicated by arrows 100 to a second, closed position (FIG. 4C). This rotational movement is illustrated in detail in FIGS. 4A-4C. In one embodiment, top holding plate 20 is pivotally and slidably joined with an elongated slot 31 that serves as a vertical guide. Elongated slot 31 is configured to guide top holding plate 20 from the open position shown in FIG. 4A to the closed position shown in FIG. 4C, which is proximate cleaning cartridge 40, by allowing it to slide and pivot within the elongated slot. In the closed position the top holding plate 20 is positioned over the bottom holding plate 30 so that probe pins 62 of the probe head 60 contact the absorbent pad 46 within the chamber 42 of the cleaning cartridge 40 (FIGS. 4C, 5 and 6). In one embodiment, the top holding plate 20 includes a plurality of guides 22 and the bottom holding plate 30 includes a plurality of holes or slots 32 for receiving the guides 22. The guides 22 and slots 32 cooperate to provide a predetermined alignment of the top holding plate 20 and the bottom holding plate 30. FIGS. 5 and 6 provide detailed views of the contact of probe pins 62 of the probe head assembly 60 and the absorbent pad 46 of the cleaning cartridge 40.

In accordance with the present invention, the penetration of tips of the probe pins 62 into the absorbent pad 46 is controlled by the design of the cleaning cartridge 40. For example, referring now to FIGS. 5 and 6, a distance D between an upper surface 48 of the cartridge 40 to a top surface 46A of the absorbent pad 46 is controlled by the design of the cartridge 40. A surface 64 of the probe head assembly 60 rests on the upper surface 48 of the cartridge 40 which, in turn, determines a depth d of penetration of the probe pins 62 into the absorbent pad 46. In the closed position the top holding plate 20 and the bottom holding plate 30 are designed to fit such that an operator does not have to align the probe head to the cleaning cartridge. As can be appreciated the clamps 22 and holes 23, the key way 50, and the guides 24 and slots 32, cooperate to facilitate the alignment of the probe head 60 and cleaning cartridge 40.

It also should be appreciated that the improved probe pin cleaning device 10 includes three integral parts (e.g., holding plates 20 and 30 and the cleaning cartridge 40) which, when combined, form an easy, reusable, self-aligning, chemically metered method of cleaning tips of probe pin 62 of probe head assemblies 60 without invasion of unwanted chemical or debris into or onto the outer surfaces of the probe head assemblies 60. The inventors have realized that once contact is established between the tips of the probe pins 62 and the absorbent pad 46, the cleaning solution 44 acts upon the tips of the probe pins 62 to remove unwanted debris. It is preferable to maintain contact for about two (2) minutes to remove the unwanted debris.

In one aspect of the present invention, the cleaning cartridge 40 is replaceable after each use or after a predetermined number of uses. In one embodiment, the holding fixtures 20 and 30 and the cleaning cartridge 40 are made of polypropylene, a chemically inert material such as polyvinylchloride, or other suitable material to resist decay from exposure to the cleaning solution 44. It should be appreciated that the cleaning solution is a specific chemical capable of dissolving and holding tin-lead accumulations formed on tips of the probe pins 62 of a probe head assembly 60.

As shown in FIG. 3B, the cleaning cartridge 40 includes a chamber shown generally at 42. The cleaning solution 44 and the absorbent pad 46, saturated with the cleaning solution, are located within the chamber 42. In one embodiment, the cleaning cartridge 40 includes a removable cover or membrane cover 45 to seal the chamber 42 and elements therein (e.g., the cleaning solution 44 and the absorbent pad 46) from the environment until it is to be used. In one embodiment, the removable cover 45 may be employed to reseal the chamber after use and may include a safety recess 47 to prevent accidental bending of probe tips 62. As such, any remaining cleaning solution and unwanted debris from the cleaning operation can be encapsulated to prevent exposure to the operator.

Some advantages of the present invention include:

Permitting easy cleaning of the tips of probe pins of a probe head assembly.

Adjustments or measurements are not needed to achieve an appropriate penetration of the probe pin tips into the cleaning pad.

Human operators are not required to handle or mix chemical cleaning solutions.

Chemical stability is maintained in the protective packaging of the cleaning cartridge.

The probe card body is kept dry so no contaminants are introduced on or into it.

All the waste is captured within the cartridge absorbent pad permitting easy and controlled disposal after use.

While the inventive probe pin cleaning device 10 has been described and illustrated in connection with preferred embodiments, many variations and modifications, as will be evident to those skilled in this art, may be made without departing from the spirit and scope of the invention.

For example, while the probe pin cleaning device has been described as a two-piece construct (e.g., the top holding plate 20 and the bottom holding plate 30), the present invention contemplates a one-piece, unitary construction and/or a multi-component assembly. The invention is thus not to be limited to the precise details of methodology or construction set forth above as such variations and modification are intended to be included within the scope of the invention.

What is claimed is:

1. A device for cleaning probe pins of a probe head assembly, said device comprising:

a first holding plate for securing said probe head assembly;

a cleaning cartridge having an upper surface and a chamber and a cleaning solution and an absorbent pad having a top surface, said absorbent pad being located within said chamber, said absorbent pad being saturated with said cleaning solution and preventing leakage of said cleaning solution out of said chamber; and a vertical guide including a substantially vertically-oriented elongated slot, said first holding plate slidably and pivotally engaging said elongated slot;

means for securing and aligning said cleaning cartridge in proximity to said probe head assembly;

wherein said first holding plate is pivoted about said vertical guide to be placed in alignment with said cleaning cartridge.

2. The cleaning device as set forth in claim 1 wherein said cleaning cartridge includes a removable and reusable cover.

3. The cleaning device as set forth in claim 1 wherein said means for securing and aligning includes a guide extending from said first holding plate and a second holding plate including a slot for receiving said guide.

4. The cleaning device as set forth in claim 1 wherein said means for securing and aligning includes a clamp extending from said first holding plate and a second holding plate including a hole for receiving said clamp.

5. The cleaning device as set forth in claim 4 wherein said first holding plate, said second holding plate and said cleaning cartridge are comprised of a chemically inert material.

6. The cleaning device as set forth in claim 5 wherein said chemically inert material is polyvinylchloride.

* * * * *